United States Patent
Ko et al.

(10) Patent No.: US 8,598,590 B2
(45) Date of Patent: Dec. 3, 2013

(54) ORGANIC LIGHT EMITTING DIODE DISPLAY DEVICE

(75) Inventors: Sam-Min Ko, Daejeon (KR); Young-Joo Kim, Goyang-si (KR)

(73) Assignee: LG Display Co., Ltd, Seoul (KR)

( * ) Notice: Subject to any disclaimer, the term of this patent is extended or adjusted under 35 U.S.C. 154(b) by 169 days.

(21) Appl. No.: 13/333,548

(22) Filed: Dec. 21, 2011

(65) Prior Publication Data

US 2013/0015458 A1 Jan. 17, 2013

(30) Foreign Application Priority Data

Jul. 12, 2011 (KR) .......................... 10-2011-0069169

(51) Int. Cl.
*H01L 33/08* (2010.01)
(52) U.S. Cl.
USPC .................. 257/71; 257/70; 257/40; 257/27; 257/E33.053; 438/82; 438/99

(58) Field of Classification Search
USPC ....... 257/71, 70, 40, 27, E33.053; 438/82, 99
See application file for complete search history.

(56) References Cited

U.S. PATENT DOCUMENTS

2008/0142808 A1* 6/2008 Lee ................................ 257/72

* cited by examiner

*Primary Examiner* — Thinh T Nguyen
(74) *Attorney, Agent, or Firm* — Brinks Gilson & Lione (57) ABSTRACT

An organic light emitting diode display device includes: a switching thin film transistor in a pixel region, the switching thin film transistor including a switching semiconductor layer of polycrystalline silicon; a driving thin film transistor connected to the switching thin film transistor, the driving thin film transistor including a driving semiconductor layer of polycrystalline silicon layer; and a light emitting diode connected to the driving thin film transistor, wherein a direction of a channel of the switching thin film transistor is parallel to a first direction, and a direction of a channel of the driving thin film transistor is perpendicular to the first direction.

12 Claims, 9 Drawing Sheets

ORGANIC LIGHT EMITTING DIODE DISPLAY DEVICE

This application claims the priority and the benefit under 35 U.S.C. §119(a) on Patent Application No. 10-2011-0069169 filed in Republic of Korea on Jul. 12, 2011, the entire contents of which are hereby incorporated by reference.

BACKGROUND

1. Field of the Invention

The present disclosure relates to an organic light emitting diode (OLED) display device, and more particularly, to an organic light emitting diode (OLED) display device having an improved display quality.

2. Discussion of the Related Art

Among various flat panel display devices (FPDs), an organic light emitting diode (OLED) display device has a relatively high brightness and a relatively low driving voltage. In addition, since the OLED display device has an emissive type emitting a light for itself, the OLED display device has a relatively high contrast ratio and a relatively thin profile. The OLED display device has an advantage in displaying moving images due to a response time of several microseconds. Further, the OLED display device has no limitation in a viewing angle and has stability even at a low temperature. Since the OLED display device is driven with a low voltage of direct current (DC) 5V to DC 15V, it is easy to design and fabricate a driving circuit. Moreover, since a deposition apparatus and an encapsulation apparatus are all that is needed for fabricating the OLED display device, the fabrication process for the OLED display device is very simple. As a result, the OLED display device has been widely used for information technology (IT) equipment, such as a television, a monitor and a mobile terminal.

Figure 1:
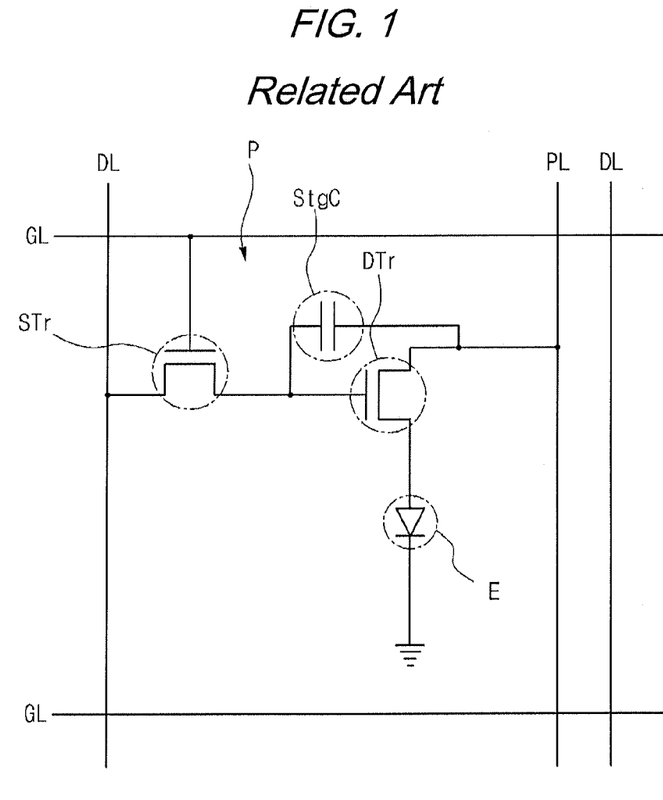
FIG. 1 is a circuit diagram showing an active matrix type organic light emitting diode display device according to the related art.

FIG. 1 is a circuit diagram showing an active matrix type organic light emitting diode display device according to the related art. In FIG. 1, a pixel region P of an active matrix type organic light emitting diode (OLED) display device includes a switching thin film transistor STr, a driving thin film transistor DTr, a storage capacitor StgC, and a light emitting diode (LED) E. A gate line GL is disposed along a first direction, and a data line DL is disposed along a second direction crossing the first direction. The gate line GL and the data line DL cross each other to define the pixel region P. A power line PL is parallel to and spaced apart from one of the gate line GL and the data line DL.

The switching TFT STr is connected to the gate line GL and the data line DL, and the driving TFT DTr is electrically connected to the switching TFT STr. In addition, the driving TFT DTr is electrically connected to the LED E and the power line PL. For example, a first electrode of the LED E may be connected to a drain electrode of the driving TFT DTr and a second electrode of the LED E may be connected to the power line PL. As a result, a source voltage of the power line PL is transmitted to the LED E through the driving TFT DTr. The storage capacitor StgC is formed between a gate electrode and a source electrode of the driving TFT DTr.

When a gate signal is applied to the gate line GL, the switching TFT STr is turned on and a data signal of the data line DL is applied to the gate electrode of the driving TFT DTr. As a result, the driving TFT DTr is turned on and a light is emitted from the LED E. The grey level of the light emitted from the LED E is determined according to the intensity of a current flowing from the power line PL to the LED E through the driving TFT DTr. Since the storage capacitor StgC keeps the voltage of the gate electrode of the driving TFT DTr constant while the switching TFT STr is turned off, the constant current flows through the LED E during a frame even when the switching TFT STr is turned off.

The switching TFT STr and the driving TFT DTr may include a semiconductor layer of polycrystalline silicon. The semiconductor layer of polycrystalline silicon is formed through a step of forming an amorphous silicon layer and a step of crystallizing the amorphous silicon layer. The step of crystallizing the amorphous silicon may be performed by various crystallization methods such as a crystallization method using a heat or a crystallization method using a laser beam.

Among various crystallization methods, a sequential lateral solidification (SLS) method using a laser beam has become of interest. The SLS method takes advantage of the fact that grains of polycrystalline silicon grow laterally from the phase boundary between liquid silicon and solid silicon. The SLS method can increase the size of the grains by controlling the energy intensity of the laser beam and the irradiation range of the laser beam used to grow the grains.

However, since sizes of the grains of polycrystalline silicon by the SLS method are different according to a direction, properties of TFTs including a semiconductor layer of polycrystalline silicon by the SLS method are also different according to the direction. As a result, a resistance of the semiconductor layer and the property of the TFT are determined according to a direction of a main grain boundary and a direction of a channel of the TFT. When a direction of a grain growth is parallel to a direction of a channel of the TFT, the TFT has an excellent device property. When a direction of a grain growth is perpendicular to a direction of a channel of the TFT, the TFT has a deteriorated device property as compared with the TFT where a direction of a grain growth is parallel to a direction of a channel. However, the TFT has an improved uniformity in a device property as compared with the TFT where a direction of a grain growth is parallel to a direction of a channel.

Each pixel region of an OLED display device may include a switching TFT controlling a data signal and a driving TFT controlling a current of an LED. Accordingly, each pixel region of an OLED display device requires at least two TFTs and at least one storage capacitor for obtaining a holding property of the at least two TFTs. For the purpose of obtaining a uniform display quality, each pixel region of an OLED display device may include a plurality of TFTs.

However, since a property and a uniformity of a TFT are determined by a direction of a grain growth of polycrystalline silicon, an OLED display device may have deterioration such as a flicker due to difference in property of a TFT when the plurality of TFTs are disposed without consideration of a direction of a grain growth. As a result, a display quality of an OLED display device is reduced.

BRIEF SUMMARY

An organic light emitting diode display device includes: at least one switching thin film transistor in a pixel region, the at least one switching thin film transistor including a switching semiconductor layer of polycrystalline silicon; at least one driving thin film transistor connected to the at least one switching thin film transistor, the at least one driving thin film transistor including a driving semiconductor layer of polycrystalline silicon layer; and a light emitting diode connected to the at least one driving thin film transistor, wherein each of the at least one switching semiconductor layer and the at least one driving semiconductor layer includes a plurality of grains, wherein each of the plurality of grains has a first width along a first direction and a second width along a second direction perpendicular to the first direction, and the first width is greater than the second width, and wherein a direction of a channel of the at least one switching thin film transistor is parallel to the first direction, and a direction of a channel of the at least one driving thin film transistor is perpendicular to the first direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE DRAWINGS AND THE PRESENTLY PREFERRED EMBODIMENTS

Reference will now be made in detail to the preferred embodiments, examples of which are illustrated in the accompanying drawings.

Figure 2A:
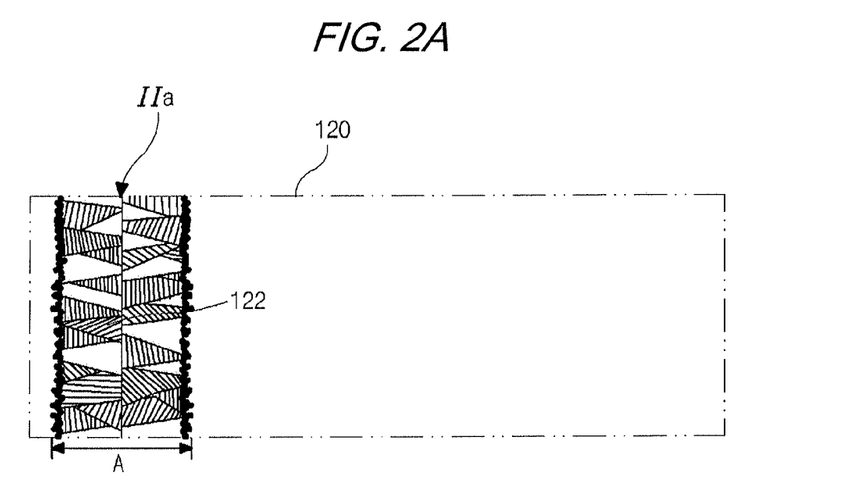
FIGS. 2A to 2C are plane views showing a process of crystallizing an amorphous silicon film through a sequential lateral solidification method for an organic light emitting diode display device according to an embodiment of the present invention.
Figure 2B:
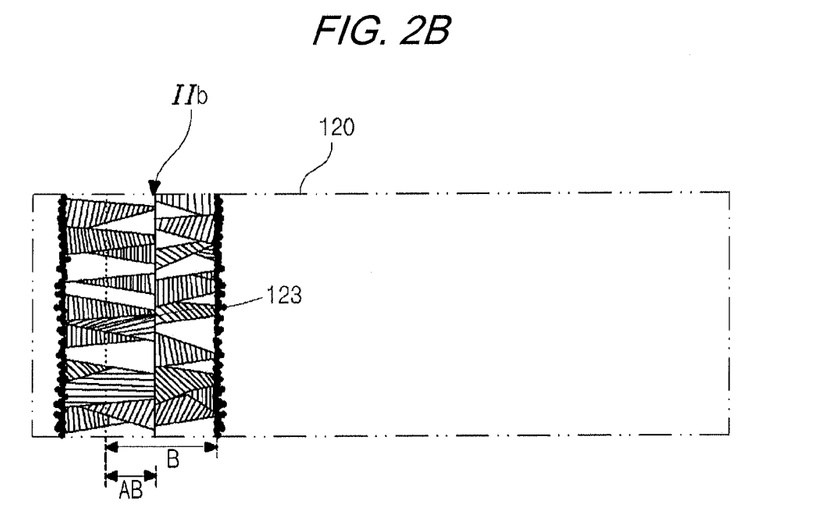
Figure 2C:
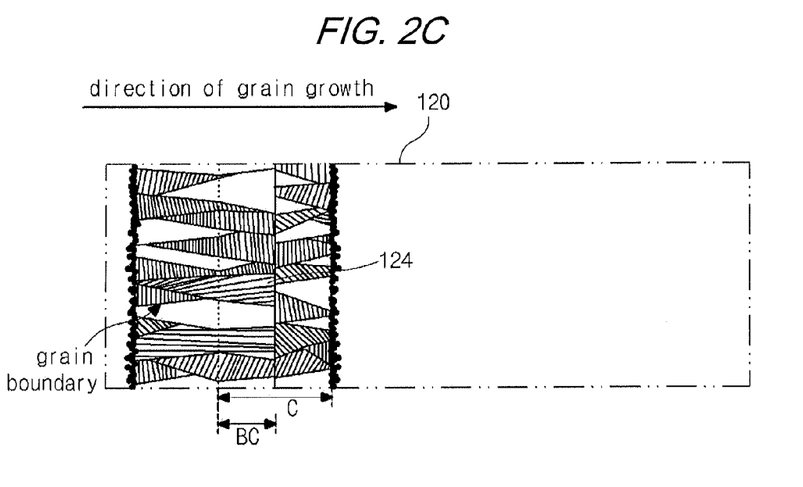

FIGS. 2A to 2C are plane views showing a process of crystallizing an amorphous silicon film through a sequential lateral solidification method for an organic light emitting diode display device according to an embodiment of the present invention.

In FIG. 2A, a first laser beam is irradiated onto a first region "A" of an amorphous silicon film 120 to grow first grains 122. Since the first grains 122 grow laterally from boundaries between a liquid phase region and a solid phase region, the first grains 122 grow from both sides of the first region "A" and grain growth stops at a first line "11a" where the first grains 122 meet each other.

In FIG. 2B, a second laser beam is irradiation onto a second region "B" of the amorphous silicon film 120 to grow second grains 123. The second region "B" includes a part of the first region "A." In a first overlapping region "AB" where the first region "A" and the second region "B" overlap each other, the first grains 122 (of FIG. 2A) act as crystallization seeds. Grain growth stops at a second line "11b" where the second grains 123 meet each other. The first line "11a" (of FIG. 2A) moves to the second line "11b" along a scan direction of the laser beam. As a result, the second grains 123 are larger than the first grains 122 after the second laser beam is irradiated.

In FIG. 2C, a third laser beam is irradiated onto a third region "C" of the amorphous silicon film 120 to grow third grains 124. The third region "C" includes a part of the second region "B." In a second overlapping region "BC" where the second region "B" and the third region "C" overlap each other, the second grains 123 (of FIG. 2B) act as crystallization seeds. As a result, the third grains 124 are much larger than the second grains 123 after the third laser beam is irradiated.

Repeated laser beam irradiation scans the whole amorphous silicon film 120 to create a polycrystalline silicon film with large grains. As a result, the polycrystalline silicon film may include a plurality of grains, and each of the plurality of grains may have a first width along a first direction parallel to a scan direction of the repeated laser beam and a second width along a second direction perpendicular to the first direction. Since the plurality of grains grow along the scan direction, the first width is greater than the second width. In addition, the first direction corresponding to the first width greater than the second width (i.e., the scan direction of the repeated laser beam) may be defined as a direction of grain growth. Furthermore, high crystallization productivity results from the small number of times the same point is irradiated.

Figure 3:
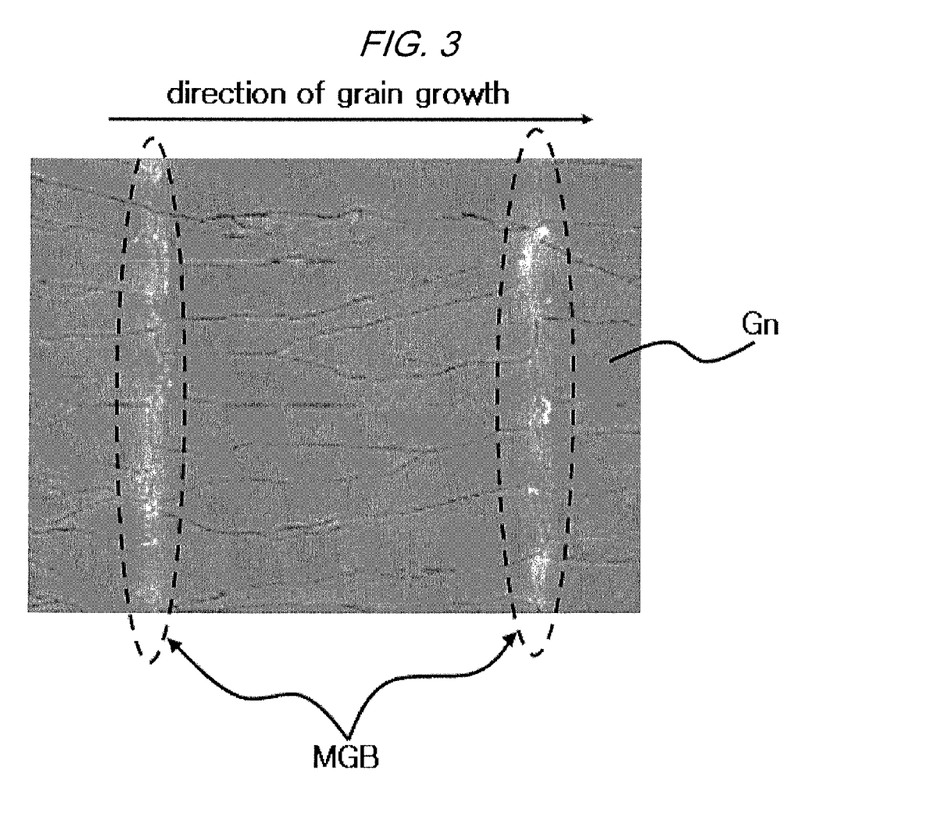
FIG. 3 is a plan image showing a surface of a polycrystalline silicon film for an organic light emitting diode display device according to an embodiment of the present invention.

FIG. 3 is a plan image showing a surface of a polycrystalline silicon film for an organic light emitting diode display device according to an embodiment of the present invention.

In FIG. 3, a plurality of grains GN having an irregular bar shape are disposed along a first direction in a polycrystalline silicon film formed by a sequential lateral solidification method and a main grain boundary MGB is defined along a second direction crossing the first direction. The main grain boundary MGB may correspond to a side of the first region "A" (of FIG. 2A).

The plurality of grains GN crystallized through a sequential lateral solidification (SLS) method have different widths along the first and second directions. Accordingly, when a thin film transistor (TFT) is formed using the polycrystalline silicon film by a SLS method as a semiconductor layer, the TFT has various properties according to relation between a direction of a channel and a direction of grain growth.

Figure 4:
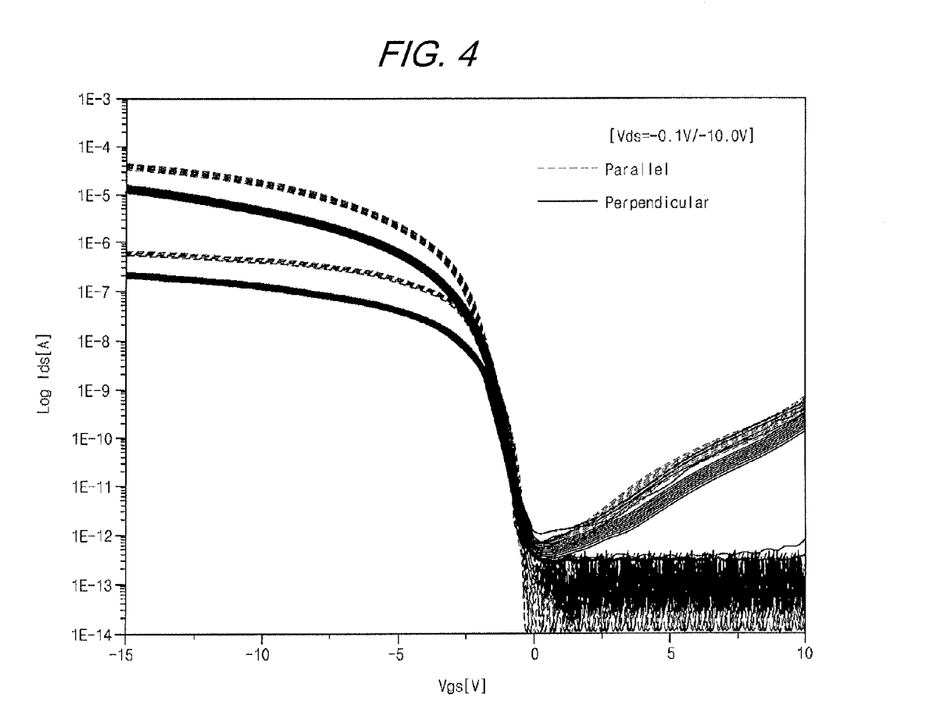
FIG. 4 is a graph showing current-voltage characteristics of polycrystalline silicon thin film transistors for an organic light emitting diode display device according to an embodiment of the present invention.

FIG. 4 is a graph showing current-voltage characteristics of polycrystalline silicon thin film transistors for an organic light emitting diode display device according to an embodiment of the present invention.

In FIG. 4, a first thin film transistor (TFT) of polycrystalline silicon is formed such that a direction of a channel is parallel to a direction of grain growth and a second TFT of polycrystalline silicon is formed such that a direction of a channel is perpendicular to a direction of grain growth. The channel of the TFT may be defined as an active region of a semiconductor layer between a source region and a drain region and the direction of the channel may be defined as a direction parallel to a line connecting the source region and the drain region. Accordingly, the direction of the channel may be parallel to a direction of current flow between the source region and the drain region.

A drain current Ids between a drain electrode and a source electrode is measured according to a gate voltage Vgs between a gate electrode and the source electrode when drain voltages Vds between the drain electrode and the source electrode are about −0.1V and about −10V. The abscissa represents the gate voltage Vgs and the ordinate represents the drain current Ids.

When an equal drain voltage Vds and an equal gate voltage Vgs are applied, the drain current Ids of the first TFT where the direction of a channel is parallel to the direction of grain growth is greater than the drain current Ids of the second TFT where the direction of a channel is perpendicular to the direction of grain growth. As a result, the first TFT has a superior current-voltage characteristic to the second TFT.

In an organic light emitting diode display device according to the present disclosure, source and drain regions of a switching TFT and a driving TFT are disposed based on properties of polycrystalline silicon formed through an SLS method.

Figure 5:
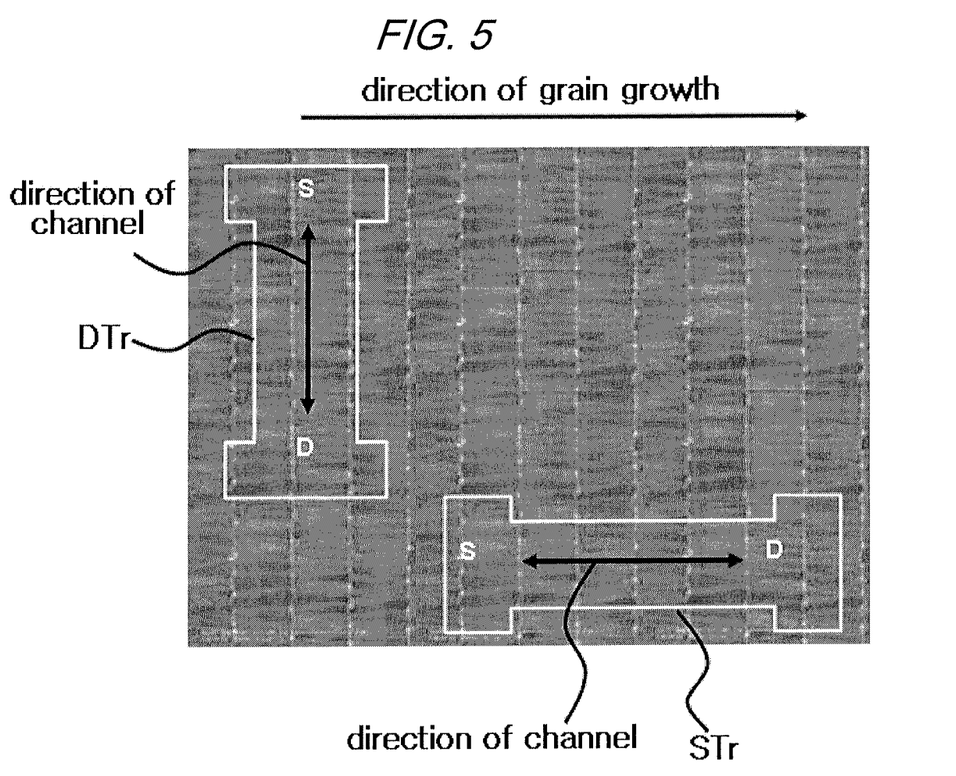
FIG. 5 is a plan view showing a source region and a drain region of a switching thin film transistor and a driving thin film transistor for an organic light emitting diode display device according to an embodiment of the present invention.
Figure 6:
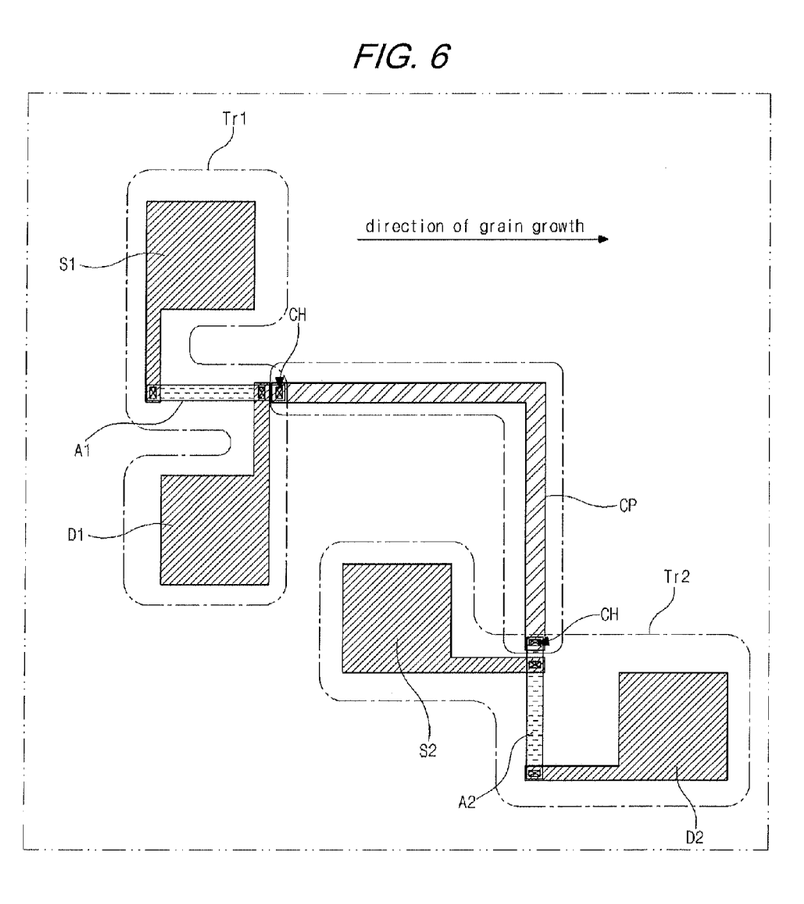
FIG. 6 is a plan view showing a connection pattern between thin film transistors for an organic light emitting diode display device according to an embodiment of the present invention.

FIG. 5 is a plan view showing a source region and a drain region of a switching thin film transistor and a driving thin film transistor for an organic light emitting diode display device according to an embodiment of the present invention, and FIG. 6 is a plan view showing a connection pattern between thin film transistors for an organic light emitting diode display device according to an embodiment of the present invention.

In FIG. 5, a source region S and a drain region D of a switching thin film transistor (TFT) STr are disposed in a pixel region of an organic light emitting diode (OLED) display device such that a direction of a channel between the source region S and the drain region D is parallel to a direction of grain growth. As a result, the switching TFT Str has excellent device properties such as an on-current, a mobility, a threshold voltage and a subthreshold swing. In addition, a source region S and a drain region D of a driving TFT DTr are disposed in a pixel region of an OLED display device such that a direction of a channel between the source region S and the drain region D is perpendicular to a direction of grain growth. As a result, the driving TFT DTr has an excellent uniformity in the device properties.

In FIG. 6, first and second thin film transistors (TFTs) Tr1 and Tr2 of polycrystalline silicon are formed in a pixel region of an organic light emitting diode (OLED) display device. The first and second TFTs Tr1 and Tr2 may be a switching TFT and a driving TFT. For convenience of illustration, gate electrodes of the first and second TFTs Tr1 and Tr2 are omitted. The first TFT Tr1 includes a first semiconductor layer A1, a first source electrode S1 and a drain electrode D1, and the second TFT Tr2 includes a second semiconductor layer A2, a second source electrode S2 and a second drain electrode D2. The first and second semiconductor layer A1 and A2 include polycrystalline silicon formed through a sequential lateral solidification (SLS) method.

The first and second TFT Tr1 and Tr2 are connected to each other through a connection pattern CP of a metallic material. For example, an end portion (e.g., a drain region) of the first semiconductor layer A1 where the first source electrode S1 is connected may extend and may be connected to one end portion of the connection pattern CP through a contact hole CH. In addition, an end portion (e.g., a source region) of the second semiconductor layer A2 where the second source electrode S2 is connected may extend and may be connected to the other end portion of the connection pattern CP through a contact hole CH. The connection pattern CP includes a horizontal portion parallel to a direction of grain growth and a vertical portion perpendicular to the direction of grain growth.

When the first and second TFTs Tr1 and Tr2 are designed such that the end portion of the first semiconductor layer A1 is electrically connected to the end portion of the second semiconductor layer A2 through a bent conduction line, the first and second semiconductor layers A1 and A2 may extend to be connected. However, since the bent extending portion of the first and second semiconductor layers A1 and A2 includes polycrystalline silicon through an SLS method, the bent extending portion has a resistance depending on the direction of grain growth. For example, the bent extending portion may include a horizontal portion that is parallel to the direction of grain growth and has a relatively low resistance and a vertical portion that is perpendicular to the direction of grain growth and has a relatively high resistance. As a result, the bent extending portion used as a conduction line transmitting a signal has a non-uniformity in resistance and the signal is deteriorated.

As shown in FIG. 6 according to the present disclosure, the first and second semiconductor layers A1 and A2 are electrically connected to each other through the bent connection pattern CP of a metallic material. As a result, the connection pattern CP used as a conduction line has a uniformity in resistance and a signal is transmitted through the connection pattern CP without deterioration.

In an OLED display device according to an embodiment of the present invention, a switching TFT, a driving TFT and a bent conduction line are formed based on a direction of grain growth of polycrystalline silicon. Since the switching TFT is formed such that a direction of a channel is parallel to a direction of grain growth, the switching TFT has excellent device properties such as an on-current, a mobility, a threshold voltage and a subthreshold swing. In addition, since the driving TFT is formed such that a direction of a channel is perpendicular to a direction of grain growth, the driving TFT has an excellent uniformity in the device properties. Further, since the bent conduction line is formed of a metallic material instead of polycrystalline silicon, a signal is transmitted between two TFTs where semiconductor layers of the two TFTs are electrically connected without deterioration. Accordingly, deterioration such as flicker is prevented and a display quality of an OLED display device is improved.

Figure 7:
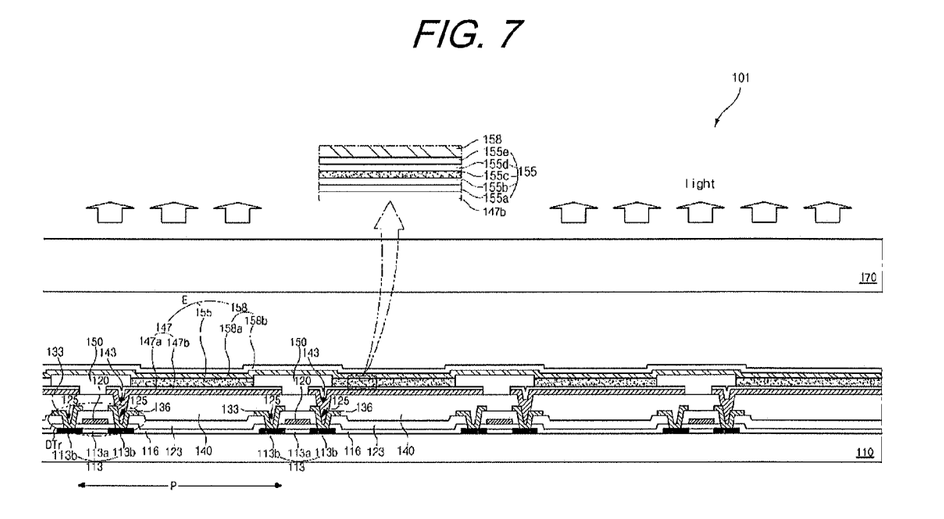
FIG. 7 is a cross-sectional view showing a top emission type organic light emitting diode display device according to a first embodiment of the present invention.

FIG. 7 is a cross-sectional view showing a top emission type organic light emitting diode display device according to a first embodiment of the present invention.

In FIG. 7, a top emission type organic light emitting diode display device 101 includes a first substrate 110 having a driving thin film transistor (TFT) DTr, a switching TFT (not shown) and a light emitting diode (LED) E and a second substrate 170 for encapsulation. The second substrate 170 may include one of a glass, a multiple layer of inorganic layers and organic layers and a film having an adhesive layer.

A semiconductor layer 113 is formed on the first substrate 110. The semiconductor layer 113 includes polycrystalline silicon formed through a sequential lateral solidification (SLS) method. Since the semiconductor layer 113 is formed by crystallizing an amorphous silicon film through an SLS method, the semiconductor layer 113 includes a plurality of grains formed along a direction of grain growth. In addition, the semiconductor layer 113 has a first region 113a of intrinsic polycrystalline silicon and a second region 113b of impurity-doped polycrystalline silicon. The first region 113a may be disposed at a center of the semiconductor layer 113 and the second region 113b may be disposed at both sides of the first region 113a. Further, the first region 113a functions as a channel and the second region 113b functions as source and drain regions of a thin film transistor.

Although not shown, a buffer layer of an inorganic insulating material such as silicon oxide ($SiO_2$) and silicon nitride (SiNx) may be formed between the first substrate 110 and the semiconductor layer 113. The buffer layer may block alkali ions ejected from the first substrate 110 during crystallization process for the semiconductor layer 113 to prevent deterioration of the semiconductor layer 113.

A gate insulating layer 116 is formed on the semiconductor layer 113 and a gate electrode 120 is formed on the gate insulating layer 116 over the first region 113a of the semiconductor layer 113. In addition, a gate line (not shown) having the same layer and the same material as the gate electrode 120 is formed on the gate insulating layer 116.

An interlayer insulating layer 123 of an inorganic insulating material such as silicon oxide ($SiO_2$) and silicon nitride (SiNx) is formed on the gate electrode 120 and the gate line. A semiconductor contact hole 125 exposing the second region 113b of the semiconductor layer 113 is formed in the interlayer insulating layer 123 and the gate insulating layer 116.

A source electrode 133 and a drain electrode 136 spaced apart from each other are formed on the interlayer insulating layer 123. The source electrode 133 and the drain electrode 136 are connected to the second region 113b of the semiconductor layer 113 through the semiconductor contact hole 125. In addition, a data line (not shown) and a power line (not shown) having the same layer and the same material as the source electrode 133 and the drain electrode 136 are formed on the interlayer insulating layer 123. The data line crosses the gate line to define a pixel region P, and the power line may be disposed to be parallel to the data line.

The semiconductor layer 113, the gate insulating layer 116, the gate electrode 120, the interlayer insulating layer 123, the source electrode 133 and the drain electrode 136 constitute the driving TFT DTr in the pixel region P. The first region 113a of the semiconductor layer 113 between the source electrode 133 and the drain electrode 136 may be defined as a channel of the driving TFT DTr. Although not shown, the switching TFT having the same structure as and connected to the driving TFT DTr is formed in the pixel region P. Further, a storage capacitor connected to the driving TFT DTr is formed in the pixel region P. The gate electrode of the switching TFT may be connected to the gate line and the source electrode of the switching TFT may be connected to the data line. As a result, the switching TFT is connected to the gate line and the data line. The first region of the semiconductor layer between the source electrode and the drain electrode of the switching TFT may be defined as a channel of the switching TFT.

Since the switching TFT is formed such that the direction of the channel is parallel to the direction of grain growth, the switching TFT has excellent device properties. In addition, since the driving TFT DTr is formed such that the direction of the channel is perpendicular to the direction of grain growth, the driving TFT DTr has an excellent uniformity in the device properties.

The switching TFT and the driving TFT DTr may have one of a positive type and a negative type according to the impurities with which the second region 113b of the semiconductor layer 113 is doped. For example, an element of group III such as boron (B) may be used as impurities for a positive type TFT, and an element of group V such as phosphorus (P) and arsenic (As) may be used as impurities for a negative type TFT. The positive type TFT uses a hole as a carrier and the negative type TFT uses an electron as a carrier.

A passivation layer 140 is formed on the driving TFT DTr and the switching TFT. The passivation layer 140 includes a drain contact hole 143 exposing the drain electrode 136 of the driving TFT DTr. In addition, the passivation layer 140 may be formed to have a flat top surface regardless of lower step differences. For example, the passivation layer 140 may include an organic insulating material such as benzocyclobutene (BCB) and acrylic resin for planarization.

A first electrode 147 connected to the drain electrode 136 of the driving TFT DTr through the drain contact hole 143 is formed in the pixel region P on the passivation layer 140. The first electrode 147 may function as one of an anode and a cathode according to work function. For example, the first electrode 147 may function as an anode when the driving TFT DTr has a positive type and may function as a cathode when the driving TFT DTr has a negative type. For convenience of illustration, the first electrode 147 is assumed to be an anode hereinafter.

The first electrode 147 functioning as an anode may include a material having a relatively high work function. For example, the first electrode 147 may have a single layer of a transparent conductive material such as indium-tin-oxide (ITO) and indium-zinc-oxide (IZO). Alternatively, the first electrode 147 may have a double layer including a first layer 147a of a metallic material such as aluminum (Al), aluminum alloy (e.g., aluminum neodymium (AlNd)) and silver (Ag) and a second layer 147b of a transparent conductive material such as indium-tin-oxide (ITO) and indium-zinc-oxide (IZO). An emission efficiency of the LED E is improved due to the first layer 147a having a relatively high reflectance and the first electrode 147 functions as an anode due to the second layer 147b having a relatively high work function.

A bank layer 150 is formed on edge portions of the first electrode 147 and the passivation layer 140, and an organic emission layer 155 is formed on the first electrode 147 exposed through the bank layer 150. The organic emission layer 155 may have one of a single layer and a multiple layer. For example, the organic emission layer 155 may have a single layer of an organic emitting material. Alternatively, the organic emission layer 155 may have a multiple layer including a hole injecting layer 155a, a hole transporting layer 155b, an emitting material layer 155c, an electron transporting layer 155d and an electron injecting layer 155e.

A second electrode 158 is formed on the organic emission layer 155 and the bank layer 150. The first electrode 147, the organic emission layer 155 and the second electrode 158 constitute the light emitting diode E emitting light. The second electrode 158 may function as one of an anode and a cathode according to work function. For example, the second electrode 158 may function as a cathode when the driving TFT DTr has a positive type and may function as an anode when the driving TFT DTr has a negative type. For convenience of illustration, the second electrode 158 is assumed to be a cathode hereinafter.

The second electrode 158 functioning as a cathode may include a material having a relatively low work function such that the work function of the second electrode 158 is lower than the work function of the first electrode 147. For example, the second electrode 158 may have a single layer of a metallic material such as silver (Ag), silver alloy (e.g., silver magnesium (MgAg)), gold (Au), magnesium (Mg), copper (Cu) and Calcium (Ca). Alternatively, the second electrode 158 may have a double layer including a first layer 158a of a metallic material such as silver (Ag), silver alloy (e.g., silver magnesium (MgAg)), gold (Au), magnesium (Mg), copper (Cu) and Calcium (Ca) and a second layer 158b of a transparent conductive material such as indium-tin-oxide (ITO) and indiumzinc-oxide (IZO). Each of the single layers and the first layer 158a of a metallic material may have a thickness such that the second electrode 158 is transparent for a top emission type.

The second substrate 170 is attached to the first substrate 110 for encapsulation with a sealing means such as a seal pattern. In another embodiment, a multiple layer including inorganic layers and organic layers or a film having an adhesive layer instead of the second substrate 170 may be attached to the first substrate 110.

Figure 8:
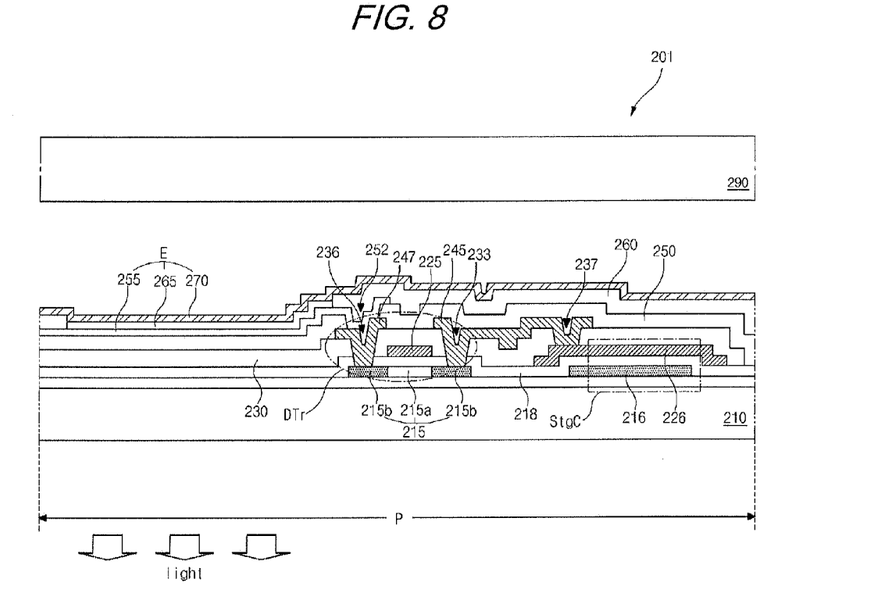
FIG. 8 is a cross-sectional view showing a bottom emission type organic light emitting diode display device according to a second embodiment of the present invention.

FIG. 8 is a cross-sectional view showing a bottom emission type organic light emitting diode display device according to a second embodiment of the present invention.

In FIG. 8, a bottom emission type organic light emitting diode display device 201 includes a first substrate 210 having a driving thin film transistor (TFT) DTr, a switching TFT (not shown) and a light emitting diode (LED) E and a second substrate 290 for encapsulation. The second substrate 290 may include one of a glass, a multiple layer of inorganic layers and organic layers and a film having an adhesive layer.

A buffer layer 208 of an inorganic insulating material such as silicon oxide ($SiO_2$) and silicon nitride (SiNx) is formed on the first substrate 210. The buffer layer 208 may block alkali ions ejected from the first substrate 210 during a subsequent crystallization process.

A semiconductor layer 215 and a first capacitor electrode 116 are formed on the buffer layer 208. The semiconductor layer 215 and the first capacitor electrode 216 include polycrystalline silicon formed through a sequential lateral solidification (SLS) method. Since the semiconductor layer 215 is formed by crystallizing an amorphous silicon film through an SLS method, the semiconductor layer 215 includes a plurality of grains formed along a direction of grain growth. In addition, the semiconductor layer 215 has a first region 215a of intrinsic polycrystalline silicon and second regions 215b of impurity-doped polycrystalline silicon, and the first capacitor electrode 216 includes impurity-doped polycrystalline silicon. The first region 215a may be disposed at a center of the semiconductor layer 215 and the second regions 215b may be disposed at both sides of the first region 215a. Further, the first region 215a functions as a channel and the second regions 215b functions as source and drain regions of a thin film transistor.

A gate insulating layer 218 is formed on the semiconductor layer 215 and the first capacitor electrode 216. Further, a gate electrode 225 is formed on the gate insulating layer 218 over the first region 215a of the semiconductor layer 215, and a second capacitor electrode 226 is formed on the gate insulating layer 218 over the first capacitor electrode 216. The first capacitor electrode 216, the gate insulating layer 218 and the second capacitor electrode 226 constitute a storage capacitor StgC. In addition, a gate line (not shown) having the same layer and the same material as the gate electrode 225 is formed on the gate insulating layer 218.

An interlayer insulating layer 230 of an inorganic insulating material such as silicon oxide ($SiO_2$) and silicon nitride (SiNx) is formed on the gate electrode 225, the gate line and the second capacitor electrode 226. First and second semiconductor contact holes 233 and 236 exposing the second regions 215b of the semiconductor layer 215 are formed in the interlayer insulating layer 230 and the gate insulating layer 218, and a capacitor contact hole 237 exposing the second capacitor electrode 226 is formed in the interlayer insulating layer 230.

A source electrode 245 and a drain electrode 247 spaced apart from each other are formed on the interlayer insulating layer 230. The source electrode 245 and the drain electrode 247 are connected to the second regions 215b of the semiconductor layer 215 through the first and second semiconductor contact holes 233 and 236. Further, the source electrode 245 is connected to the second capacitor electrode 226 through the capacitor contact hole 237. In addition, a data line (not shown) and a power line (not shown) having the same layer and the same material as the source electrode 245 and the drain electrode 247 are formed on the interlayer insulating layer 230. The data line crosses the gate line to define a pixel region P, and the power line may be disposed to be parallel to the data line.

The semiconductor layer 215, the gate insulating layer 218, the gate electrode 225, the interlayer insulating layer 230, the source electrode 245 and the drain electrode 247 constitute the driving TFT DTr in the pixel region P. The first region 215a of the semiconductor layer 215 between the source electrode 245 and the drain electrode 247 may be defined as a channel of the driving TFT DTr. Although not shown, the switching TFT having the same structure as and connected to the driving TFT DTr is formed in the pixel region P. The gate electrode of the switching TFT may be connected to the gate line and the source electrode of the switching TFT may be connected to the data line. As a result, the switching TFT is connected to the gate line and the data line. The first region of the semiconductor layer between the source electrode and the drain electrode of the switching TFT may be defined as a channel of the switching TFT.

Since the switching TFT is formed such that the direction of the channel is parallel to the direction of grain growth, the switching TFT has excellent device properties. In addition, since the driving TFT DTr is formed such that the direction of the channel is perpendicular to the direction of grain growth, the driving TFT DTr has an excellent uniformity in the device properties.

The switching TFT and the driving TFT DTr may have one of a positive type and a negative type according to the impurities with which the second regions 215b of the semiconductor layer 215 and the first capacitor electrode 216 is doped. For example, an element of group III such as boron (B) may be used as impurities for a positive type TFT, and an element of group V such as phosphorus (P) and arsenic (As) may be used as impurities for a negative type TFT. The positive type TFT uses a hole as a carrier and the negative type TFT uses an electron as a carrier.

A passivation layer 250 is formed on the driving TFT DTr and the switching TFT. The passivation layer 250 includes a drain contact hole 252 exposing the drain electrode 247 of the driving TFT DTr. In addition, the passivation layer 250 may be formed to have a flat top surface regardless of lower step differences. For example, the passivation layer 250 may include an organic insulating material such as benzocyclobutene (BCB) and acrylic resin for planarization.

A first electrode 255 connected to the drain electrode 247 of the driving TFT DTr through the drain contact hole 252 is formed in the pixel region P on the passivation layer 250. The first electrode 255 may function as one of an anode and a cathode according to work function. For example, the first electrode 255 may function as an anode when the driving TFT DTr has a positive type and may function as a cathode when the driving TFT DTr has a negative type. For convenience of illustration, the first electrode 255 is assumed to be an anode hereinafter.

The first electrode 255 functioning as an anode may include a material having a relatively high work function. For example, the first electrode 255 may have a single layer of a transparent conductive material such as indium-tin-oxide (ITO) and indium-zinc-oxide (IZO). Alternatively, the first electrode 255 may have a double layer including a first layer of a metallic material such as aluminum (Al), aluminum alloy (e.g., aluminum neodymium (AlNd)) and silver (Ag) and a second layer of a transparent conductive material such as indium-tin-oxide (ITO) and indium-zinc-oxide (IZO). The first layer of a metallic material may have a thickness such that the first electrode 255 is transparent for a bottom emission type.

A bank layer 260 is formed on edge portions of the first electrode 255 and the passivation layer 250, and an organic emission layer 265 is formed on the first electrode 255 exposed through the bank layer 250. The organic emission layer 265 may have one of a single layer and a multiple layer. For example, the organic emission layer 265 may have a single layer of an organic emitting material. Alternatively, the organic emission layer 265 may have a multiple layer including a hole injecting layer, a hole transporting layer, an emitting material layer, an electron transporting layer and an electron injecting layer.

A second electrode 270 is formed on the organic emission layer 265 and the bank layer 260. The first electrode 255, the organic emission layer 265 and the second electrode 270 constitute the light emitting diode E emitting light. The second electrode 270 may function as one of an anode and a cathode according to work function. For example, the second electrode 270 may function as a cathode when the driving TFT DTr has a positive type and may function as an anode when the driving TFT DTr has a negative type. For convenience of illustration, the second electrode 270 is assumed to be a cathode hereinafter.

The second electrode 270 functioning as a cathode may include a material having a relatively low work function such that the work function of the second electrode 270 is lower than the work function of the first electrode 255. For example, the second electrode 270 may have a single layer of a metallic material such as silver (Ag), silver alloy (e.g., silver magnesium (MgAg)), gold (Au), magnesium (Mg), copper (Cu) and Calcium (Ca). Alternatively, the second electrode 270 may have a double layer including a first layer of a metallic material such as silver (Ag), silver alloy (e.g., silver magnesium (MgAg)), gold (Au), magnesium (Mg), copper (Cu) and Calcium (Ca) and a second layer of a transparent conductive material such as indium-tin-oxide (ITO) and indium-zinc-oxide (IZO). Each of the single layer and the first layer of a metallic material may have a thickness of about 500 Å to about 2000 Å such that the second electrode 270 is reflective for a bottom emission type. An emission efficiency of the LED E is improved due to the single layer and the first layer of a metallic material having a relatively high reflectance.

The second substrate 290 is attached to the first substrate 210 for encapsulation with a sealing means such as a seal pattern. In another embodiment, a multiple layer including inorganic layers and organic layers or a film having an adhesive layer instead of the second substrate 290 may be attached to the first substrate 210.

Consequently, in an organic light emitting diode display device of the present disclosure, a switching thin film transistor includes a semiconductor layer of polycrystalline silicon through a sequential lateral solidification such that a direction of a channel is parallel to a direction of grain growth and a driving thin film transistor includes a semiconductor layer of polycrystalline silicon through a sequential lateral solidification such that a direction of a channel is perpendicular to a direction of grain growth. In addition, a bent conduction line is formed of a metallic material instead of polycrystalline silicon. As a result, the switching thin film transistor has improved device properties and the driving thin film transistor has an improved uniformity in device properties. Further, the bent conduction line has an improved uniformity in resistance and a signal is transmitted through the bent conduction line without deterioration. Accordingly, deterioration in display quality such as a flicker is prevented and the organic light emitting diode display device stably operates with an improved display quality.

It will be apparent to those skilled in the art that various modifications and variations can be made in an organic light emitting diode display device of the present disclosure without departing from the sprit or scope of the invention. Thus, it is intended that the present invention covers the modifications and variations of this invention provided they come within the scope of the appended claims and their equivalents.

The invention claimed is:

1. An organic light emitting diode display device, comprising:
   at least one switching thin film transistor in a pixel region, the at least one switching thin film transistor including a switching semiconductor layer of polycrystalline silicon;
   at least one driving thin film transistor connected to the at least one switching thin film transistor, the at least one driving thin film transistor including a driving semiconductor layer of polycrystalline silicon layer; and
   a light emitting diode connected to the at least one driving thin film transistor,
   wherein each of the at least one switching semiconductor layer and the at least one driving semiconductor layer includes a plurality of grains,
   wherein each of the plurality of grains has a first width along a first direction and a second width along a second direction perpendicular to the first direction, and the first width is greater than the second width, and
   wherein a direction of a channel of the at least one switching thin film transistor is parallel to the first direction, and a direction of a channel of the at least one driving thin film transistor is perpendicular to the first direction.

2. The device according to claim 1, wherein each of the switching semiconductor layer and the driving semiconductor layer is formed by crystallizing an amorphous film through a sequential lateral solidification method, and the first direction is a direction of grain growth defined by a scan direction of a laser beam for the sequential lateral solidification.

3. The device according to claim 1, further comprising a gate line and a data line connected to the at least one switching thin film transistor, the gate line and the data line crossing each other to define the pixel region.

4. The device according to claim 3, wherein the at least one driving thin film transistor includes a plurality of driving thin film transistors.

5. The device according to claim 4, further comprising:
   a power line connected to the at least one driving thin film transistor; and
   a storage capacitor connected to the at least one driving thin film transistor, the storage capacitor including a storage semiconductor layer of polycrystalline silicon.

6. The device according to claim 5, further comprising a bent conduction line of a metallic material connecting at least two of the at least one switching thin film transistor, the at least one driving thin film transistor and the storage capacitor.

7. The device according to claim 6, wherein the bent conduction line is connected to at least two of the switching semiconductor layer, the driving semiconductor layer and the storage semiconductor layer, and wherein the bent conduction line includes a first portion parallel to the first direction and a second portion parallel to the second direction.

8. The device according to claim 1, wherein the at least one switching thin film transistor and the at least one driving thin film transistor are formed on a first substrate,
wherein a passivation layer is formed on the at least one switching thin film transistor and the at least one driving thin film transistor, and
wherein the light emitting diode is formed on the passivation layer.

9. The device according to claim 8, wherein the at least one switching thin film transistor comprises:
the switching semiconductor layer on the first substrate;
a gate insulating layer on the switching semiconductor layer;
a switching gate electrode on the gate insulating layer over the switching gate electrode;
an interlayer insulating layer on the switching gate electrode;
a switching source electrode on the interlayer insulating layer; and
a switching drain electrode spaced apart from the switching source electrode.

10. The device according to claim 9, wherein the at least one driving thin film transistor comprises:
the driving semiconductor layer on the first substrate;
the gate insulating layer on the driving semiconductor layer;
a driving gate electrode on the gate insulating layer over the driving gate electrode;
the interlayer insulating layer on the driving gate electrode;
a driving source electrode on the interlayer insulating layer; and
a driving drain electrode spaced apart from the driving source electrode.

11. The device according to claim 10, wherein the light emitting diode comprises:
a first electrode connected to the driving drain electrode;
a bank layer on edge portions of the first electrode;
an organic emission layer on the first electrode exposed through the bank layer; and
a second electrode on the organic emission layer and the bank layer.

12. The device according to claim 11, wherein the organic light emitting diode display device has one of a top emission type where a light is emitted through the second electrode and a bottom emission type where a light is emitted through the first electrode.

* * * * *